United States Patent [19]
Yusa et al.

[11] Patent Number: 4,833,204
[45] Date of Patent: May 23, 1989

[54] EPOXY RESIN COMPOSITION FOR A COPPER-CLAD LAMINATE

[75] Inventors: Masami Yusa, Shimodate; Katsuji Shibata, Shimozuma; Yasuo Miyadera, Shimodate, all of Japan

[73] Assignee: Hitachi Chemical Company, Ltd., Tokyo, Japan

[21] Appl. No.: 240,604

[22] Filed: Sep. 6, 1988

Related U.S. Application Data

[63] Continuation of Ser. No. 774, Jan. 6, 1987, abandoned.

[30] Foreign Application Priority Data

Jan. 10, 1986 [JP] Japan ................... 61-3886
Jan. 10, 1986 [JP] Japan ................... 61-3887

[51] Int. Cl.$^4$ ............... C08L 63/00; C08L 61/10; C08L 29/02
[52] U.S. Cl. ............... 525/113; 525/481; 525/486; 525/487; 528/94
[58] Field of Search .......... 528/94; 525/113, 486, 525/487, 481

[56] References Cited

U.S. PATENT DOCUMENTS

| | | | |
|---|---|---|---|
| 3,493,630 | 2/1970 | Salensky | 525/486 |
| 3,756,984 | 9/1973 | Klaren | 260/47 EC |
| 4,026,872 | 5/1977 | Saida | 525/486 |
| 4,066,625 | 1/1978 | Bolger | 260/59 R |
| 4,240,605 | 12/1983 | Kaufman | 528/94 |
| 4,246,394 | 1/1981 | Schülde | 528/117 |
| 4,335,228 | 6/1982 | Beitchman | 525/528 |
| 4,358,571 | 11/1982 | Kaufman | 525/524 |
| 4,436,892 | 3/1984 | Zondler | 528/117 |
| 4,514,556 | 4/1985 | Sawa | 528/117 |
| 4,533,715 | 8/1985 | Lee | 525/526 |
| 4,552,814 | 11/1985 | Cavitt | 528/94 |
| 4,559,398 | 12/1985 | Tesch | 528/94 |

FOREIGN PATENT DOCUMENTS 55-147524 11/1980 Japan .

OTHER PUBLICATIONS

Abandoned U.S. Ser. No. 06/065,664 cited in U.S. Pat. No. 4,240,605.

Primary Examiner—C. Warren Ivy
Attorney, Agent, or Firm—Antonelli, Terry & Wands

[57] ABSTRACT

An epoxy resin composition for a copper-clad laminate comprising an epoxy resin having at least two epoxy groups in one molecule, a phenolic compound having at least two functional groups in one molecule as a hardener, an imidazole compound having a masked imino group as a hardening accelerator, and one or more of nitrogen compounds selected from the group consisting of urea derivatives represented by the formula $R^1$—N-H—CO—$NH_2$, wherein $R^1$ is hydrogen or an organic group; acid amide compounds; and guanidine derivatives, which is advantageously used for the material of a copper-clad laminate. Accordingly, the copper-clad laminate is especially used for the production of printed circuit boards, and its drilling property, peeling resistance of the copper foil, adhesive property, and heat resistance are improved remarkably. In addition, this epoxy resin composition has an excellent storing stability.

5 Claims, 3 Drawing Sheets

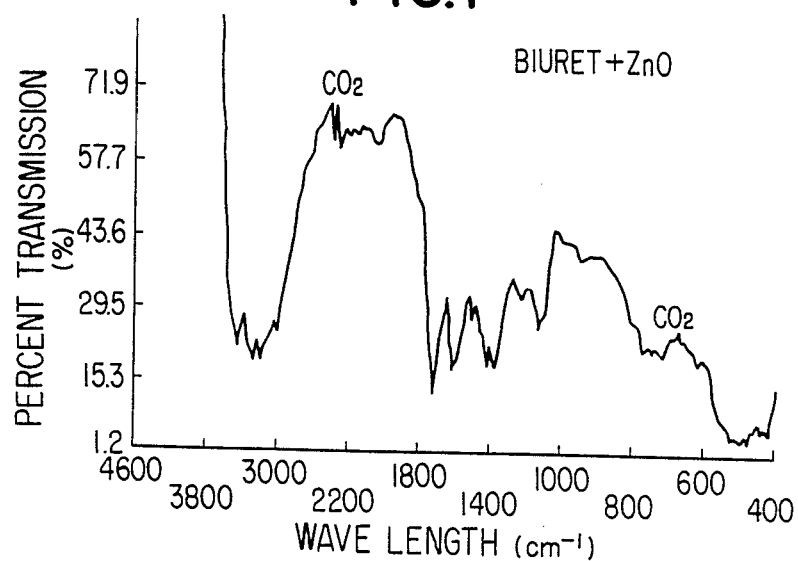
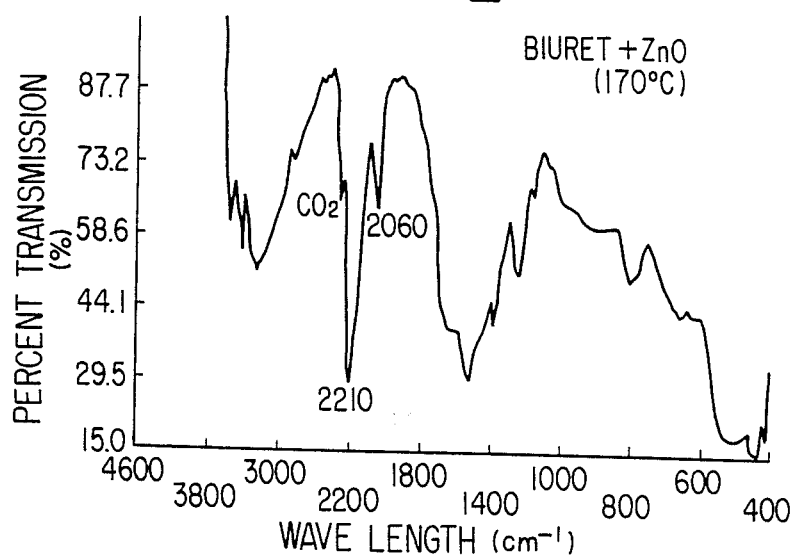

1

EPOXY RESIN COMPOSITION FOR A COPPER-CLAD LAMINATE

This is a continuation of application Ser. No. 000,774, filed Jan. 6, 1987, now abandoned.

BACKGROUND OF THE INVENTION (1) Field of the Invention

This invention relates to an epoxy resin composition for the manufacture of a copper-clad laminate. More particularly, it provides the epoxy resin composition having an excellent adhesive property to metal.

(2) Description of the Prior Art

Due to a high density of a printed circuit board in recent years, it has been proposed to make the printed circuit board in a high multi-layered structure and the diameter of each through hole smaller, resulting in requirement for a printed circuit board material having a good drilling properties in time of drilling a through hole. Among the drilling properties, the occurence of smears is in serious problem in improvement of the drilling properties because it prevents conduction between an inner-layered circuit copper and a plated copper plated on the through hole causing a considerable decline of reliability for connection of the through hole. To solve such problem, there is a way to remove such smears.

Normally, makers of printed circuit boards have removed the smears by use of concentrated sulfuric acid, hydrofuluoric acid, chromic acid or the like, but these procedures have problems in view of safety. Further, such a conventional treatment provides cause to spoil the inner wall of the through hole and decrease reliability for connection of the through hole.

Further, as another means to prevent the decline of the drilling property due to the smears, there is a way to prevent occurrence of them. The smears are caused due to the resin, softened by a friction heat occurring at the time of drilling, being adhered to a section of the inner-layered circuit copper foil within the through hole. The conventional copper-clad laminate is manufactured by the use of the epoxy resin or the like as a prepreg resin which comprises dicyandiamide as a hardener. When such resins are hardened, the softening and melting-adhesion temperature thereof is low. Even though it has fully been hardened, its softening and melting-adhesion temperature is about 250° C. It is generally said that the drilling temperature at drilling reaches about 300° C., therefor, when drilling the conventional copper-clad laminate, the hardened resin is softened, and thus, occurrence of the smears is inevitable.

Still further, when the printed circuit board carrying parts is used, its use temperature may reach over 100° C. Accordingly, it must have a long-term heat resistance in atmosphere. In the case that the laminate made of the conventional epoxy resins hardened by dicyandiamide is used for a long time in a drier at 170° C., it takes about 500 hours until the ratio of maintaining flexural strength reaches not more than 50%. If occurrence of the smears will be prevented and the aforesaid time will be prolonged further, the copper-clad laminate will enhance reliability furthermore.

As a resin satisfying the aforesaid two requirements, there are epoxy resins hardened by a multi-functional phenolic compound. When applying for the printed circuit boards the copper-clad laminate of the epoxy resins hardened by the multi-functional phenolic compound, the occurrence of the smears at the drilling time is less than one-half of the conventional copper-clad laminate of the epoxy resins hardened by dicyandiamide.

In addition, the former is superior to the latter in view of long-term heat resistance. More particularly, the treatment time at 170° C. of the former at the time when the ratio of maintaining flexural strength reaches not more than 50% becomes more than twice longer than that of the latter.

However, in view of adhesive property to metal such as copper foil, the epoxy resins hardened by the multi-functional phenolic compound are inferior to the conventional epoxy resins. For example, whereas the peeling resistance of the copper foil (its one side is roughened) having the thickness of 35 μm of the conventional product is about 2 kg/cm, that of a product hardened by the multi-functional phenolic compound is 1 to 1.5 kg/cm.

Further, the peeling resistance of a product of which metal glossy surface is roughened and oxidized is also decreased. For example, concerning the adhesive property to a glossy surface of the copper foil provided with the above treatments, the peeling resistance of the conventional product is about 1.5 kg/cm, while that of the product made of the epoxy resins hardened by the multi-functional phenolic compound is about 0.5 to 1 kg/cm. Further, when measuring the peeling resistance of the test pieces of those products dipped in a hydrochloric acid, that of the dipped conventional product is nearly similar to that of a non-dipped conventional product, while that of a dipped product hardened by the multi-functional phenolic compound is reduced to half over that of a non-dipped product hardened by same.

SUMMARY OF THE INVENTION

It is an object of this invention to provide an epoxy resin composition hardened by a multi functional phenolic compound for a copper-clad laminate which is used for a printed circuit board. More specifically, it provides an improved adhesive property to metal for the said composition which provides a good drilling property and a long-term resistance in atmosphere for a copper-clad laminate.

It is another object of this invention to provide an epoxy resin composition for a copper-clad laminate, which has a high peeling resistance of a copper foil even after it has been treated with hydrochloric acid.

It is a further object of this invention to provide an epoxy resin composition which has an excellent storing stability of solution thereof.

That is to say, the epoxy resin composition for a copper-clad laminate of the present invention is characterized by comprising an epoxy resin having at least two epoxy groups in one molecule, a phenolic compound having at least two functional groups in one molecule as a hardener, an imidazole compound having a masked imino group as a hardening accelerator, and one or more of nitrogen compounds selected from the group consisting of urea derivatives represented by the formula $R^1$-NH-CO-NH$_2$, wherein $R^1$ is hydrogen or an organic group, acid amide compounds, and guanidine derivatives.

DETAILED DESCRIPTION OF PREFERRED EMBODIMENTS

The epoxy resin which is used in this invention is a multi-functional one having at least two epoxy groups within one molecule, but it is not limited to a particular expoxy resin. For example, it may be bisphenol A type epoxy resin, bisphenol F type epoxy resin, bisphenol S type epoxy resin, phenol novolak type epoxy resin, cresol novolak type epoxy resin, bisphenol A novolak type epoxy resin, bisphenol F novolak type epoxy resin, alicyclic epoxy resin, glycidyl ester type epoxy resin, glycidylamine type expoxy resin, hydantoin type epoxy resin, isocyanurate type epoxy resin, aliphatic chain type epoxy resin and their halides, hydrides, or the like. The molecular weight of the epoxy resin is not limited specifically. Further, it is possible to make a combination of two or more epoxy resins.

Further, any phenolic compound which is a multi-functional one having two or more functional groups within one molecule and can be polymerized with the epoxy resin is acceptable. For example, it may be bisphenol A, bisphenol F, polyvinylphenol or novolak resins obtained from phenol, cresol, alkylphenol, catechol, bisphenol A, bisphenol F or the like, and halides of these phenolic resins. It is also possible to make a combination of two or more multi-functional phenolic compounds. The amount of the multi-functional phenolic compound is not limited to a particluar value, but in view of drilling property, the number of the hydroxyl groups is preferably 0.5 to 1.5 equivalent to the epoxy groups of the epoxy resin.

The hardening accelerator to be used is an imidazole compound of which imino group has been masked by acrylonitrile, isocyanate, melamine acrylate or the like. When this hardening accelerator is used, it is possible to obtain a prepreg having twice or more storing stability of a conventional one.

The imidazole compounds to be used in this invention include imidazole, 2-ethylimidazole, 2-ethyl-4-methylimidazole, 2-phenylimidazole, 2-undecylimidazole, 1-benzyl -2-methylimidazole, 2-heptadecylimidazole, and 4,5-diphenylimidazole, The masking agents include acrylonitrile, phenylene diisocyanate, toluene diisocyanate, naphthalene diisocyanate, hexamethylene diisocyanate, methylene bis-phenylisocyanate, melamine acrylate, and the like.

It is also possible to make a combination of two or more hardening accelerators.

The amount of the hardening accelerator to be used is not limited, but it is preferably 0.01 to 5 weight parts per 100 weight parts of epoxy resins. When the amount of the hardening accelerator is less than 0.01 weight parts, the effect for accelerating hardening becomes small. When the amount is more than 5 weight parts, storing stability becomes decreased.

The urea derivative to be used in this invention is represented by the following formula,

R$^1$NH-CO-NH$_2$ (in which R$^1$ is hydrogen or an organic group.)

The substituent R$^1$ is hydrogen, or an organic group, such as, alkyl group, cyano group, nitro group, nitroso group, acyl group, a substituent containing alkyl group or alkenyl group, a substituent containing aromatic ring such as phenyl group, a substituent containing a heterocyclic ring like imidazole.

More concretely, the urea derivatives include, for example, urea, N-monoalkylurea, N-allylurea, acetylurea, benzoylurea, benzenesulfonylurea, p-toluenesulfonylurea, phenylurea, nitrosourea, nitrourea, biurea, biuret, guanylurea, γ-carbamylpropyltriethoxysilane, other ureid compounds, isourea compounds, semicarbazid compounds, and the like. Each of them may be chain-type or ring-type. Urea is used preferably.

The acid amide compound to be used in this invention has a structure represented by the following general formula such as R$^2$CONR$^3$R$^4$ Primary amide
(R$^2$CO)$_2$NR$^3$ Secondary amide
(R$^2$CO)$_3$N Tertiary amide (in which R$^2$, R$^3$, and R$^4$ are each hydrogen, an alkyl group, a halogen atom or an aryl group.)

More concretely, the acid amide compounds are formamide, formethylamide, formdimethylamide, formallylamide, acetamide, acetomethylamide, acetodiethylamide, methylenediacetamide, ethylidendiacetamide, chloralacetamide, chloralformamide, diacetamide, diacetomethylamide, triacetamide, acetochloroamide, acetobromoamide, benzamide, dibenzamide, tribenzamide, N-chlorobenzamide, N-bromobenzamide, benzanilide, and the like. Each of them may be chain or ring compounds. Preferably, the primary amides are used.

Further, the guanidine derivatives to be used in this invention has a structure represented by the following formula; such as

R$^5$NH-CNH-NHR$^6$ (R$^5$ and R$^6$ are each hydrogen, an alkyl group, a halogen atom or an aryl group.)

More concretely, the guanidine derivatives include dicyandiamide derivatives such as dicyandiamide, dicyandiamide-aniline additive, dicyandiamide-methylaniline additive, dicyandiamide-diaminodiphenylmethane additive, dicyandiamide-dichlorodiaminodiphenylmethane additive, dicyandiamide-diaminodiphenylether additive or the like; guanidine salts such as aminoguadine hydrochloride, guanidine hydrochloride, guanidine nitrate, guanidine carbonate, guanidine phosphate, guanidene sulfamate, aminoguanidine bicarbonate; acetylguanidine, diacetylguanidine, propionylguanidine, dipropionylguanidine, cyanoacetylguanidine, guanidine succinate, diethylcyanoacet ylguanidine, dicyandiamizine, N-oxymethyl-N'-cyanoguanidine, N,N'-dicarboethoxyguanidine, chloroguanidine, bromoguanidine, and the like.

It is also possible to make a combination of two or more nitrogen compounds.

The amount of said nitrogen compound to be used is preferably 0.1 to 10 weight parts per 100 weight parts of epoxy resin. When it is less than 0.1 weight part, the adhesion strength such as peeling resistance of the copper foil is insufficient. On the other hand, when it is more than 10 weight parts, the drilling property and the heat resistance become inferior.

In the case the guanidine derivatives are used as the nitrogen compound, it is desirable to use a coupling agent at the same time. By using the guanidine derivative together with the coupling agent, it is possible to improve remarkably the peeling resistance of the copper foil.

The coupling agent to be used includes silane coupling agents, titanate coupling agents, or the like.

The silane coupling agents include γ-glycidoxypropyltr imethoxysilane, γ-glycidoxypropyltriethoxysilane, γ-glycidoxypropylmethyldimethoxysilane, N-β(aminoethy)-γ-aminopropylmethoxysilane, γ-mercaptopropyltrimethoxysilane, γ-aminopropyltriethoxysilane, γ-ureidopropyltriethoxysila ne, N-phenyl-γ-aminopropyltrimethoxysilane, N-vinylbenzil -δ-aminopropyltriethoxysilane, and the like. Any silane coupling agent that has a functional group reactive with epoxy group or phenolic hydroxyl group and the hydrolyzable alkoxy group at the same time may be enployed.

The titanate coupling agents include isopropyl-tri-isostearoyl titanate, isopropyl-tri-dodecylbenzene-sulfonyl titanate, isopropyl tris (dioctylpyrophosphate) titanate, tetraisopropyl bis (dioctylphosphite) titanate, tetraoctyl bis (di-tridecylphoshite) titanate, tetra (2,2-diallyloxymethyl-1-butyl) bis (di-tridecyl) phosphite titanate, bis (dioctylpyrophosphate) oxyacetate titanate, bis (dioctylpyrophosphate) ethylene titanate, and the like. Further, any titanate having a low molecular weight is acceptable.

The amount of the coupling agent to be used is preferably 0.1 to 10 weight parts per 100 weight parts of epoxy resins. When it is less than 0.1 weight part, there is no effect for the peeling resistance of the copper foil. When it is more than 10 weight parts, the heat resistance and the drilling property become decresed.

The epoxy resin composition for a copper-clad laminate of this invention is used in various forms. When it is coated on or impregnated in substrates, a certain solvent is often added. The solvents to be used include acetone, methyl ethyl ketone, toluene, xylene, methyl isobutyl ketone, ethyl acetate, ethyleneglycol-monomethylether, N,N-dimethylformamide, N,N-dimethylacetamide, methanol, ethanol, and the like. Further, it is possible to make a combination of two or more above solvents.

The concentration of a resin content in a varnish is not limited, but it is preferably 20 to 90 weight per cent. Further, it is possible that the varnish contents such an ordinary additive as flame-retardants, fillers, pigments or the like.

The prepreg can be obtained by impregnating the substrate with the varnish obtained by the above blending, and drying at a temperature of 80° to 200° C. within a drying furnace. The term "drying" in this invention means the removal of the solvent in the case it is used. If no slovent is used, it means that fluidity at a room temperature disappears.

The substrate to be used in this invention includes a woven cloth such as glass fiber, aramide fiber, silica fiber, SiC fiber or the like, a non-woven cloth, paper, or the like, and it is not limited particularly.

By making use of the prepreg obtained by the above procedures, the copper-clad laminate is produced. The conditions for the manufacture of the copper-clad laminate are the same ones in a known manufacturing process. The normal drying conditions are as follows: 30 to 120 minutes at a temperature of 150° C. to 170° C. and under the pressure of 40 to 80 kg/cm.

It is considered that the reason why the adhesion strength of the copper foil is increased by the present resin composition is due to that the aforesaid nitrogen compound reacts with a thin metal oxide layer on the copper foil surface to produce a new organic metal compound. The fact that the nitrogen compound is reactive with the metal oxide under certain circumstances was confirmed by the following process.

The IR spectrum of a test sample in which a biuret is mixed with zinc oxide is shown in FIG. 1.

The IR spectrum of such mixed sample heated for one hour at 170° C. is shown in FIG. 2.

The IR spectrum of biuret is heated for one hour at 170° C.

Thus, only when the biuret was mixed with the zinc oxide and then heated, absorption is generated at 2080 $cm^{-1}$ and 2200 $cm^{-1}$, and therefor it is considered that the organic metal compound is produced. In case of copper oxide, the same result was obtained. The same operation has been conducted for the sample obtained by mixing guanidine and zinc oxide and heating, and thus obtained IR spectrum is shown in FIGS. 4 to 6. It is considered that the acid amide compound shown the same conditions (not illustrated).

BRIEF DESCRIPTION OF THE DRAWINGS

FIG. 1 shows IR spectrum of a mixture of biuret and zinc oxide.

FIG. 2 shows IR spectrum of a sample obtained by heating a mixture of biuret and zinc oxide for one hour at 170° C.

EXAMPLES 1 to 18 AND COMPARATIVE EXAMPLES 1 to 10

Figure 3:
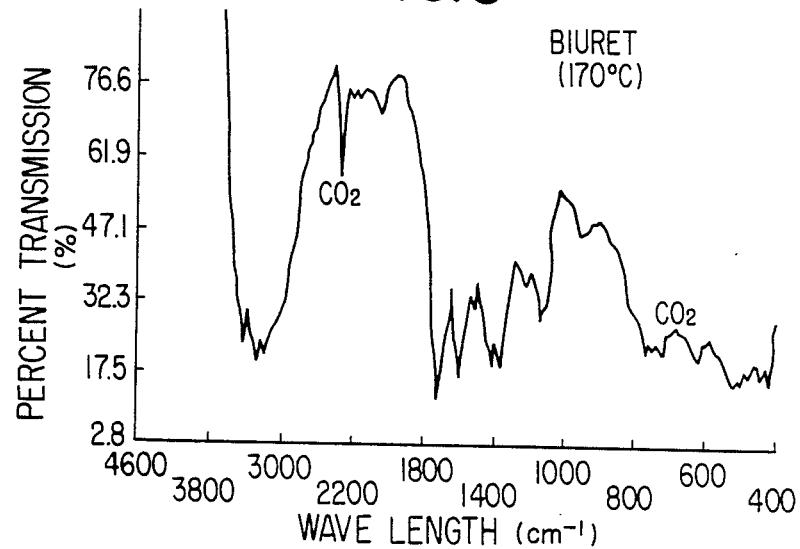
FIG. 3 shows IR spectrum of a sample, obtained by heating biuret for one hour at 170° C.
Figure 4:
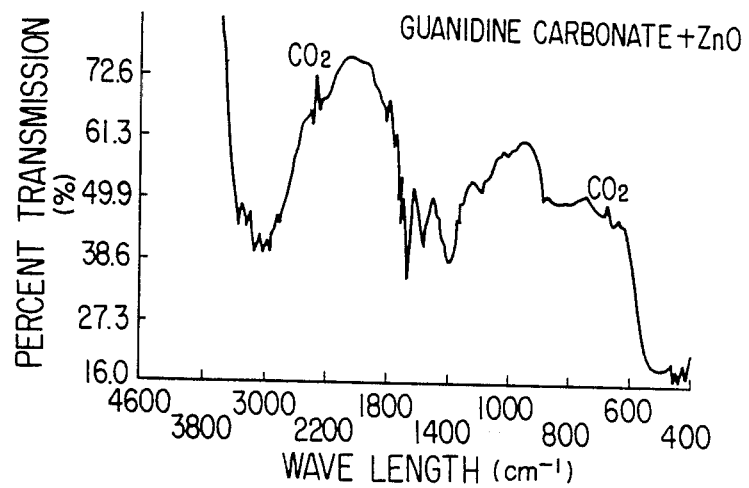
FIGS. 4 to 6 show respective IR spectra, when the aforesaid same operations for guanidine carbonate were carried out.
Figure 5:
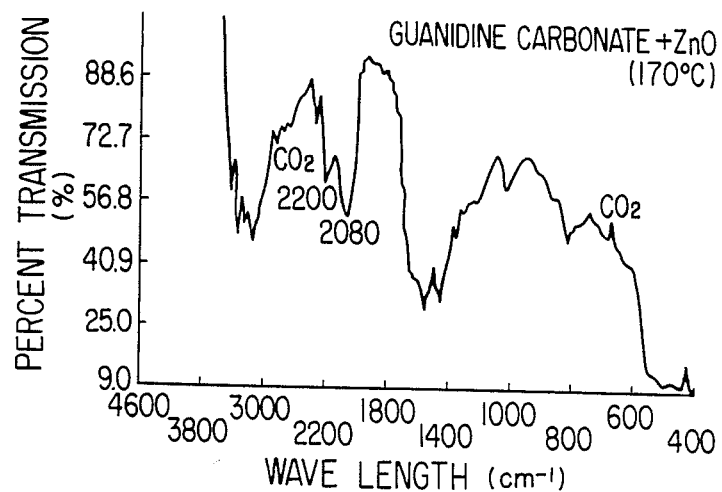
Figure 6:
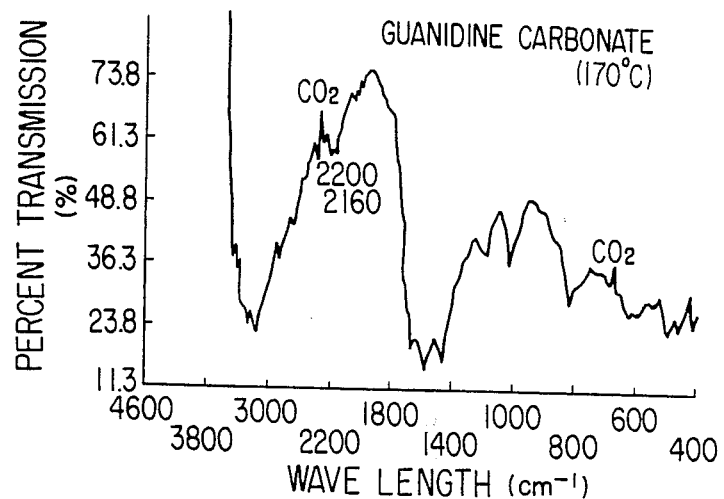

Hereinafter, the present invention will now be described by the following Examples, but the scope of this invention is not limited to those Examples.

EXAMPLE 1

| | |
|---|---|
| Brominated bisphenol A-type epoxy resin (Epoxy equivalent 530) | 80 weight parts |
| Phenol novolak type epoxy resin (Epoxy equivalent 200) | 20 weight parts |
| Phenol novolak resin | 30 weight parts |
| Urea | 2 weight parts |
| 2-ethyl-4-methylimidazole of which imino group is masked by hexamethylene diisocyanate: | 0.5 weight part |

The above compounds were dissolved in methyl ethyl ketone and methanol, thereby the varnish having 60 weight % of involatile content was prepared.

EXAMPLE 2

A varnish was prepared in substantially the same manner as in Example 1 except that 2 weight parts of biuret was used instead of urea.

EXAMPLE 3

A varnish was prepared in substantially the same manner as in Example 1, except that 2 weight parts of 1, γ-carbamylpropyl-triethoxysilane was used instead of urea.

EXAMPLE 4

A varnish was prepared in substantially the same manner as in Example 1, except that 30 weight parts of cresol novolak instead of phenol novolak and 5 weight parts of guanylurea instead of urea were used.

EXAMPLE 5

A varnish was prepared in substantially the same manner as in Example 1, except that 35 weight parts of bisphenol A novolak instead of phenol novolak and 3 weight parts of biuret instead of urea were used.

EXAMPLE 6

A varnish was prepared in substantially the same manner as in Example 1, except that 25 weight parts of polyvinylphenol instead of phenol novolak and 1 weight parts of γ-carbamylpropylethoxysilane instead of phenol novolak were used.

COMPARATIVE EXAMPLE 1

A varnish was prepared in substantially the same manner as in Example 1, except that urea was not used.

COMPARATIVE EXAMPLE 2

A varnish was prepared in substantially the same manner as in Example 1, except that 3 weight parts of 2-ethyl-4-methylimidazole whose imino group was masked by hexamethylene diisocyanate instead of 1, 2-ethyl-4methylimidazole of 0.3 weight parts was used.

COMPARATIVE EXAMPLE 3

A varnish was prepared in substantially the same manner as in Example 1, except that 4 weight parts of dicyandiamide was used instead of phenolnovolak. Further, ethyleneglycol-monomethylether was added as the solvent.

Prepreg were prepared by impregnating glass cloths of 0.1 mm in thickness with the varnish obtained in Examples 1 to 6 and Comparative Examples 1 to 3 followed by heating for five minutes at 140° C. By using three prepregs and two copper foils each having 35 μm in thickness, a copper-clad laminate (MCL) was produced under the conditions of 170° C., 60 minutes and 50 kg/cm². After the MCL had been treated to be provided with an inner layered circuit, 6-layered circuit board was produced by using three plys of MCL and six plys of prepregs. The above 6-layered circuit board was examined in the point of drilling property, heat resistance in atmosphere, peeling resistance of copper foil, and thermal resistance to soldering. Further, to evaluate the storing stability of the prepreg, the change of the prepreg gelation time with the passage of time was examined. The result is shown Table 1.

Note (1) Evaluation for the occurrence of smears

After the through holes of 6-layered circuit board had been plated, observation by a microscope was conducted for the connection portion of the inner layered copper of 20 holes in proximity of 5000 hits and 10000 hits and the plated copper of the through holes, thereby the occurrence ratio of the smears was examined. The average occurrence ratio of the smears was made by calculating the ratio of height of each smear relative to each connection height followed by averaging.

Note (2)
Measurement of peeling resistance of an outer layered copper foil:

By forming a line of 1 mm in width on the outer layered copper foil, the peeling resistance in a direction of 90° on the line was measured by means of the peeling speed of 50 mm/min.

Measurement of peeling resistance of inner layered copper foil:

By providing the glossy surface of the inner layered copper foil with roughening treatment and copper oxide treatment, the peeling resistance to peeling between the copper oxide treated surface and the prepreg layer was measured by the same conditions.

Treatment by hydrochloric acid:

The MCL on which a line of 1 mm in width was formed was dipped for 60 minutes in 18% hydrochloric acid at 35° C.

Note (3) Thermal resistance to soldering

The test piece was dipped for 20 seconds in a solder of 260° C. Then, by visual eyes, no-expanded test piece was accepted (OK), but expanded one was not accepted (NG).

Note (4) Heat resistance in atmosphere

The MCL treated by etching was heated for a long time at a temperature of 170° C. in a dryer. The flexural resistance was measured every 100 hours. When it is less than one-half of the flexural resistance measured before the treatment, the treatment time was shown in Table.

Note (5) Gelation time of prepreg

By setting as an initial rate the gelation time at 160° C. of the prepreg immediately after impregnating, after the prepreg had been stored for 60 days under the conditions of 20° C. in temperature 40% in humidity, the gelation time at 160° C. of the prepreg was measured.

When urea derivative was not used, as shown in Comparative Example 1, the drilling property was good, but the peeling resistance of copper foil became low. Further, when the masked imidazole compound was not used, as shown in Compartive Example 2, the change of the gelation time of the prepreg with the passage of time was large and its storing stability became inferior. Further, when the hardener was replaced by dicyandiamide as shown in Comparative Example 3, the occurrence ratio of smears was frequent and the drilling property became worse.

TABLE 1

| | | | Example | | | | | | Comparative Example | | |
|---|---|---|---|---|---|---|---|---|---|---|---|
| | | | 1 | 2 | 3 | 4 | 5 | 6 | 1 | 2 | 3 |
| Occurrence | 5,000 | Upper | 3.5 | 2.8 | 2.3 | 1.5 | 2.7 | 1.7 | 1.8 | 3.8 | 18.8 |
| ratio of | hits | Lower | 4.1 | 3.1 | 1.9 | 2.0 | 2.0 | 2.1 | 2.5 | 3.9 | 17.1 |
| smears (%) | 10,000 | Upper | 6.2 | 5.3 | 3.6 | 4.5 | 3.1 | 2.3 | 4.4 | 5.6 | 29.3 |
| | hits | Lower | 6.9 | 6.5 | 5.1 | 3.8 | 2.5 | 2.8 | 4.9 | 7.1 | 28.7 |
| Peeling resistance | Outer | Normal condition | 1.9 | 1.8 | 2.1 | 2.0 | 2.1 | 1.9 | 1.4 | 1.9 | 2.1 |
| of copper foil | layer | Resistance to hydrochloric acid | 1.8 | 1.7 | 2.0 | 1.9 | 1.8 | 1.8 | 0.7 | 1.7 | 1.9 |
| (kgf/cm) | Inner | Normal condition | 1.2 | 1.1 | 1.2 | 1.1 | 1.0 | 1.2 | 0.8 | 1.2 | 1.3 |
| | layer | Resistance to hydrochloric acid | 1.0 | 0.9 | 1.1 | 1.0 | 0.9 | 1.0 | 0.4 | 1.0 | 1.1 |
| Thermal resistance | Normal condition | | OK | OK | OK | OK | OK | OK | OK | OK | OK |
| to soldering | D-2/100 | | OK | OK | OK | OK | OK | OK | OK | OK | OK |
| Heat resistance in atmosphere 170° C. (hr) | | | 1100 | 900 | 1000 | 1000 | 800 | 1200 | 1200 | 1000 | 400 |
| Prepreg gelation | Initial period | | 165 | 148 | 163 | 178 | 153 | 147 | 160 | 148 | 235 |
| time (second) | After 60 days | | 156 | 127 | 158 | 165 | 145 | 139 | 153 | 111 | 226 |

EXAMPLE 7

| | |
|---|---|
| Brominated bisphenol A type epoxy resin (Epoxy equivalent 530) | 80 weight parts |
| Phenol novolak type epoxy resin | 20 weight parts |

-continued

| | |
|---|---|
| (Epoxy equivalent 200) | |
| Phenol novolak resin | 30 weight parts |
| Acetamide | 2 weight parts |
| 2-ethyl-4-methylimidazole whose imino group was masked by hexamethylene diisocyanate: | 0.5 weight part |

The above compounds were dissolved in methyl ethyl ketone, to prepare the varnish of 60 weight % involatile content.

EXAMPLE 8

A varnish was prepared in substantially the same manner as in Example 6, except that 2 weight parts of benzamide was used instead of acetamide.

EXAMPLE 9

A varnish was prepared in substantially the same manner as in Example 6, except that 2 weight parts of formamide was used instead of acetamide.

EXAMPLE 10

A varnish was prepared in substantially the same manner as in Example 6, except that 2 weight parts of benzanilide was used instead of acetamide.

EXAMPLE 11

A varnish was prepared in substantially the same manner as in Example 6, except that 2 weight parts of acetochloroamide was used instead of acetamide.

EXAMPLE 12

A varnish was prepared in substantially the same manner as in Example 7, except that 30 weight parts of cresol novolak instead of phenol novolak and 3 weight parts of formamide instead of acetamide were used.

EXAMPLE 13

A varnish was prepared in substantially the same manner as in Example 7, except that 35 weight parts of bisphenol-A novolak instead of phenol novolak instead of acetamide, and 5 weight parts of acetamide instead of 2 weight parts of acetamide were used.

COMPARATIVE EXAMPLE 4

A varnish was prepared in substantially the same manner as in Example 7, except that 0.3 weight parts of 7, 2-ethyl -4-methylimidazole was used instead of 2-ethyl-4-methylimidazole whose imino group was masked by hexamethylene diisocyanate in Example of 0.3 weight parts was compounded.

COMPARATIVE EXAMPLE 5

A varnish was prepared in substantially the same manner as in Example 7, except that 4 weight parts of dicyandiamide was used instead of phenol novolak resin and ethyleneglycol-monomethylether was further added.

Like Examples 1 to 6, MCL plys were made with the varnishs obtained in Examples 7 to 13 and Comparative Examples 4 and 5, and then their performance test was conducted. The result was shown in Table 2. MCL plys prepared by the use of the acid amide compounds also showed the same tendency like these prepared by the use of the urea compounds.

TABLE 2

| | | | Example | | | | | | Comparative Example | |
|---|---|---|---|---|---|---|---|---|---|---|
| | | | 7 | 8 | 9 | 10 | 11 | 12 | 13 | 4 | 5 |
| Occurrence ratio of smears (%) | 5,000 hits | Upper | 3.1 | 3.9 | 2.3 | 2.8 | 3.0 | 2.9 | 4.0 | 4.1 | 18.8 |
| | | Lower | 2.4 | 4.0 | 4.1 | 3.3 | 2.1 | 2.6 | 1.8 | 2.9 | 17.1 |
| | 10,000 hits | Upper | 5.8 | 6.5 | 5.5 | 4.7 | 8.1 | 3.3 | 5.3 | 6.6 | 29.3 |
| | | Lower | 7.0 | 6.0 | 8.2 | 7.2 | 6.6 | 3.9 | 4.9 | 7.2 | 28.7 |
| Peeling resistance of copper foil (kgf/cm) | Outer layer | Normal condition | 1.9 | 2.0 | 2.0 | 1.8 | 1.9 | 1.9 | 2.0 | 1.9 | 2.1 |
| | | Resistance to hydrochloric acid | 1.8 | 1.8 | 1.8 | 1.6 | 1.7 | 1.8 | 1.9 | 1.7 | 1.9 |
| | Inner layer | Normal condition | 1.2 | 1.0 | 1.0 | 1.0 | 1.1 | 1.1 | 1.0 | 1.1 | 1.3 |
| | | Resistance to hydrochloric acid | 1.0 | 0.9 | 0.9 | 0.8 | 0.9 | 1.0 | 1.0 | 0.9 | 1.1 |
| Thermal resistance to soldering | Normal condition | | OK | OK | OK | OK | OK | OK | OK | OK | OK |
| | D-2/100 | | OK | OK | OK | OK | OK | OK | OK | OK | OK |
| Heat resistance in atmosphere 170° C. (hr) | | | 800 | 900 | 1000 | 900 | 900 | 1000 | 900 | 900 | 400 |
| Prepreg gelation time (second) | Initial period | | 158 | 165 | 149 | 148 | 150 | 163 | 147 | 155 | 235 |
| | After 60 days | | 149 | 151 | 130 | 137 | 140 | 156 | 140 | 109 | 226 |

EXAMPLE 14

| | |
|---|---|
| Brominated bisphenol A type epoxy resin | 80 weight parts |
| (Epoxy equivalent 530) | |
| Phenol novolak type epoxy resin | 20 weight parts |
| (Epoxy equivalent 200) | |
| Phenol novolak resin | 30 weight parts |
| o-tolylbiguanide | 2 weight parts |
| γ-glycidoxypropyltrimethoxysilane | 2 weight parts |
| 1-cyanoethyl-2-phenylimidazole | 0.2 weight part |

The above compounds were dissolved in methyl ethyl ketone to obtain the varnish having 60 weight % involatile content was prepared. A prepreg was obtained by impregnating a glass cloth of 0.1 mm in thickness with this varnish followed by drying for 5 minites at 130° C.

EXAMPLE 15

A varnish was prepared in substantially the same manner as in Example 14, except that 2 weight parts of guanidine carbonate was used instead of o-tolylbiguanide.

EXAMPLE 16

A varnish was prepared in substantially the same manner as in Example 14, except that 5 weight parts of 1,3-di-o-tolylguanidine was used instead of o-tolybiguanide.

EXAMPLE 17

A varnish was prepared in substantially the same manner as in Example 14, except that 1 weight part of γ-mercaptopropylmethyldimethoxysilane was used instead of γ-glycidoxypropyltrimethoxysilane.

EXAMPLE 18

A varnish was prepared in substantially the same manner as in Example 14, except that 1 weight part of tetraoctyl bis(ditridecylphosphite)titanate was used instead of γ-glycidoxypropyltrimethoxysilane.

COMPARATIVE EXAMPLE 6

A varnish was prepared in substantially the same manner as in Example 14, except that both o-toylbiguanide and γ-glycidoxypropyltrimetoxysilane were not used.

COMPARATIVE EXAMPLE 7

A varnish was prepared in substantially the same manner as in Example 14, except that o-tolylbiguanide was not used.

COMPARATIVE EXAMPLE 8

A varnish was prepared in substantially the same manner as in Example 14, except that γ-glycidoxytrimethoxysilane was not used.

COMPARATIVE EXAMPLE 9

A varnish was prepared in substantially the same manner as in Example 14, except that 2-phenylimidazole was used instead of 1-cyanoethyl-2-phenylimidazole.

COMPARATIVE EXAMPLE 10

A varnish was prepared in substantially the same manner as in Example 14, except that 4 weight parts of dicyandiamide was used instead of phenol novolak resin. In addition to methyl ethyl ketone in Comparative Example 1, N, N-dimethylformamide was used as the solvent. Drying was carried out for 5 minutes at 130° C. and then again for 5 minutes at 170° C.

By using three plys of prepregs obtained in Examples 14 to 18 and Comparative Examples 6 to 10 and two plys of copper foils each having 35 μm in thickness, copper-clad laminates (MCL) were prepared under the conditions of 170° C., 60 minutes and 50 kg/cm². After providing MCL with an inner layered circuit, 6-layered circuit boards were prepared by using 3 sheets of MCL and 6 sheets of prepreg for each board. The properties of these 6-layered circuit boards were examined in the point of drilling property, heat resistance in atmosphere, peeling resistance of the copper foil, and thermal resistance to soldering. Further, to evaluate the storing stability of the prepregs, the change of gelation time of the prepreg with the passage of time was examined. The result was shown in Table 3.

When the coupling agent was not used as shown in Comparative Examples 6 to 8, the peeling resistance of the copper foil was not improved, while when the guanidine derivative was not used, the rate after the hydrochloric acid treatment was not improved. Further, as shown in Comparative Example 9, when the imidazole whose imino group was not masked, the change of the prepreg gelation time with passage of time was large and its storing stability was inferior. Further, when dicyandiamide was used without using the multi-functional phenol as a hardener, a large number of smears occurred and the heat resistance in atmosphere was inferior.

What is claimed is:

1. An epoxy resin composition for a copper-clad laminate consisting essentially of:
   (A) an epoxy resin having at least two epoxy groups in one molecule,
   (B) a novolak resin or a polyvinylphenol having two or more hydroxyl groups, as a hardener,
   (C) an imidazole compound having a masked imino group masked by reacting the imino group with a masking agent as a hardener, the imidazole compound being selected from the group consisting of imidazole, 2-ethylimidazole, 2-ethyl-4-methylimidazole, 2-phenylimidazole, 2-undecylimidazole, 1-benzyl-2-methylimidazole, and 2-heptadecylimidazole, and the masking agent being selected from the group consisting of acrylonitrile, phenylene diisocyanate, toluene diisocyanate, naphthalene diisocyanate, hexamethylene diisocyanate, methylene diisocyanate methylene bisphenyl isocyanate, and melamine acrylate, and
   (D) one or more nitrogen compounds selected from the group consisting of urea, biurea, biuret, guanylurea, γ-carbamylpropyltriethoxysilane, formamide, acetamide, acetochloroamide, benzamide, benzanilide, dicyandiamide, phenylbiguanide, o-tolylbiguanide, bis(biguanylphenyl)methane, bis(biguanylchlorophenyl)methane, bis(biguanylphenyl) ether, guanidine carbonate, and 1,3-di-o-tolylguanidine,
   the number of hydroxyl groups of said (B) novolak resin or polyvinylphenol being 0.5 to 1.5 equivalent to the number of the epoxy groups of said (A) epoxy resin, the amount of said (C) imidazole compound being 0.01 to 5 weight parts per 100 weight parts of said (A) epoxy resin, and the amount of said (D) nitrogen compound being 0.1 to 10 weight parts per 100 weight parts of said (A) epoxy resin.

TABLE 3

| | | | Example | | | | | Comparative Example | | | | |
|---|---|---|---|---|---|---|---|---|---|---|---|---|
| | | | 14 | 15 | 16 | 17 | 18 | 6 | 7 | 8 | 9 | 10 |
| Occurrence | 5,000 | Upper | 1.5 | 3.5 | 2.9 | 2.1 | 3.0 | 1.1 | 1.8 | 2.2 | 2.2 | 15.9 |
| ratio of | hits | Lower | 2.6 | 1.9 | 2.5 | 2.7 | 3.3 | 2.3 | 2.5 | 1.9 | 2.9 | 16.1 |
| smears (%) | 10,000 | Upper | 5.5 | 4.9 | 3.3 | 5.4 | 7.1 | 3.8 | 4.6 | 5.3 | 6.1 | 24.3 |
| | hits | Lower | 4.7 | 6.0 | 5.6 | 4.2 | 7.5 | 4.2 | 6.1 | 5.9 | 4.8 | 31.5 |
| Peeling resistance | Outer | Normal condition | 2.0 | 1.9 | 2.1 | 2.0 | 1.8 | 1.4 | 2.0 | 1.5 | 2.0 | 2.1 |
| of copper foil | layer | Resistance to hydrochloric acid | 1.9 | 1.9 | 2.0 | 2.0 | 1.7 | 0.6 | 0.6 | 1.3 | 1.9 | 2.0 |
| (kgf/cm) | Inner | Normal condition | 1.2 | 1.3 | 1.2 | 1.2 | 1.0 | 0.8 | 1.2 | 1.0 | 1.2 | 1.3 |
| | layer | Resistance to hydrochloric acid | 1.0 | 1.1 | 1.1 | 1.0 | 0.8 | 0.3 | 0.4 | 0.8 | 1.0 | 1.1 |
| Thermal | Normal condition | | OK | OK | OK | OK | OK | OK | OK | OK | OK | OK |
| resistance | D-2/100 | | OK | OK | OK | OK | OK | OK | OK | OK | OK | OK |
| to soldering | | | | | | | | | | | | |
| Heat resistance in atmosphere 170° C. (hr) | | | 1000 | 900 | 1000 | 900 | 800 | 1200 | 1100 | 900 | 1000 | 500 |
| Prepreg gelation | Initial period | | 158 | 155 | 159 | 135 | 148 | 168 | 165 | 155 | 153 | 230 |
| time (second) | After 60 days | | 145 | 150 | 153 | 121 | 133 | 160 | 161 | 141 | 108 | 215 |

2. An epoxy resin composition for a copper-clad laminate as claimed in claim 1, wherein said (D) nitrogen compound is urea or γ-carbamypropyltriethoxysilane.

3. An epoxy resin composition for a copper-clad laminate as claimed in claim 1, wherein one or more nitrogen compounds selected from the group consisting of dicyandiamide, phenylbiguanide, o-tolylbiguanide, bis(biguanylphenyl)methane, bis(biguanylchlorophenyl)methane, bis(biguanylphenyl) ether, guanidine carbonate, and 1,3-di-o-tolylguanidine are employed with a coupling agent.

4. An epoxy resin composition for a copper-clad laminate as claimed in claim 1, wherein the epoxy resin composition is in the form of a vanish containing a solvent.

5. An epoxy resin composition for a copper-clad laminate as claimed in claim 4, wherein said (D) nitrogen compound is urea or γ-carbamylpropyltriethoxysilane.

* * * * *